US010006819B2

(12) United States Patent
Kim et al.

(10) Patent No.: US 10,006,819 B2
(45) Date of Patent: Jun. 26, 2018

(54) GRAPHENE-BASED TOUCH SENSOR DEVICE USING TRIBOELECTRICITY AND METHOD FOR FABRICATING THE DEVICE

(71) Applicant: RESEARCH & BUSINESS FOUNDATION SUNGKYUNKWAN UNIVERSITY, Suwon-si, Gyeonggi-do (KR)

(72) Inventors: Sang Woo Kim, Yongin-si (KR); Tae Ho Kim, Seoul (KR); Usman Khan, Suwon-si (KR); Han Jun Ryu, Suwon-si (KR); Seung Choi, Ansan-si (KR); Minki Kang, Suwon-si (KR); Dong Hoon Kim, Daejeon (KR); Wan Chul Seung, Yongin-si (KR)

(73) Assignee: RESEARCH & BUSINESS FOUNDATION SUNGKYUNKWAN UNIVERSITY, Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/587,004

(22) Filed: May 4, 2017

(65) Prior Publication Data
US 2017/0322094 A1 Nov. 9, 2017

(30) Foreign Application Priority Data
May 9, 2016 (KR) .......................... 10-2016-0056245

(51) Int. Cl.
*H01L 29/16* (2006.01)
*G01L 1/00* (2006.01)
(Continued)

(52) U.S. Cl.
CPC .......... *G01L 1/005* (2013.01); *H01L 29/1606* (2013.01); *H01L 29/51* (2013.01); *H01L 29/66742* (2013.01); *H01L 29/78684* (2013.01)

(58) Field of Classification Search
CPC .......................... H01L 29/1606; H01L 29/78
(Continued)

(56) References Cited

U.S. PATENT DOCUMENTS 9,790,928 B2 * 10/2017 Wang ........................ F03G 5/06
2008/0286521 A1 * 11/2008 Eberlein ................ B82Y 10/00
428/114
(Continued)

FOREIGN PATENT DOCUMENTS

KR 10-2015-0054549 A 5/2015

*Primary Examiner* — Jami M Valentine
(74) *Attorney, Agent, or Firm* — Lucas & Mercanti, LLP

(57) ABSTRACT

The present disclosure provides a graphene-based touch sensor device using triboelectric effect, the device comprising: a substrate; a first electrode layer disposed on the substrate; a graphene channel layer disposed on the substrate, wherein the graphene channel layer is flush with the first electrode layer, and is spaced from the first electrode layer; a gate dielectric layer in partial contact with the electrode layer and the graphene channel layer respectively; source and drain electrodes formed on both opposing ends of the graphene channel layer respectively; and a triboelectric layer formed on the first electrode layer, wherein the triboelectric layer generates a triboelectric potential via contact of an external friction material therewith, wherein the contact of the external friction material is detected based on a current change in the graphene channel layer due to the triboelectric potential applied thereto.

20 Claims, 9 Drawing Sheets

(51) Int. Cl.
*H01L 29/786* (2006.01)
*H01L 29/66* (2006.01)
*H01L 29/51* (2006.01)

(58) Field of Classification Search
USPC .......................................................... 257/78
See application file for complete search history.

(56) References Cited

U.S. PATENT DOCUMENTS

2014/0338458 A1* 11/2014 Wang ...................... G01L 1/005
   73/658
2016/0209278 A1* 7/2016 Hus ............................ G01L 1/16

* cited by examiner negative bias applied to graphene positive bias applied to graphene

GRAPHENE-BASED TOUCH SENSOR DEVICE USING TRIBOELECTRICITY AND METHOD FOR FABRICATING THE DEVICE

CROSS-REFERENCE TO RELATED APPLICATION

This application claims the benefit of Korean patent application No. 10-2016-0056245 filed on May 9, 2016, the entire content of which is incorporated herein by reference for all purposes as if fully set forth herein.

BACKGROUND OF THE INVENTION

Field of the Invention

The present disclosure relates to a graphene-based touch sensor using triboelectric effect. The present disclosure also relates to a method for manufacturing a graphene-based touch sensor using triboelectric effect.

Discussion of Related Art

With the advance of digital technology in recent years, the electronic equipment used in everyday life has become thinner, lighter and smaller enough to carry with one hand. Therefore, the size and weight of an input device such as a keypad, keyboard, and a mouse, etc. is getting smaller and smaller to make the input device thinner and lighter. In order to maximize the visual effect and reduce the space constraint, a touch screen or touch panel is integrated with a display as an output device. Such a touch screen may be classified into a resistive type, a capacitive type, an electromagnetic type, a SAW (surface acoustic wave t) type, an infrared type, and an ultrasonic type, etc.

Recent studies focusing on graphene used in such a touch screen or touch sensing unit have been actively conducted. Graphene is composed of a carbon mono-atomic layer having a hexagonal structure in a two-dimensional plane. It has a carrier mobility of about 200,000 $cm^2/Vs$, a high thermal conductivity of about 5000 W/mK, and a Young's modulus of about 1 TPa. Graphene is very transparent with very good visible light transmittance. However, a graphene-based touch sensing device that has been studied so far uses a principle that resistance and conductivity changes due to graphene deformation are detected when a vertical force or tensile/compressive strain is applied thereto. The conventional graphene-based touch sensor device is a capacitive type as employed in a general touch screen. Thus, the conventional graphene-based touch sensor device has a disadvantage in that it reacts only when an electrically conductive object touches the sensor, and, further, the reactivity thereof is lowered in a high humidity environment.

SUMMARY OF THE INVENTION

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure is to provide a graphene-based touch sensor using triboelectric effect wherein a triboelectric generator using a conductive electrode material and a transistor using graphene are combined into the graphene-based touch sensor, thereby controlling the charge transport in the graphene by triboelectric potential generated from the triboelectric generator.

In a first aspect of the present disclosure, there is provided a graphene-based touch sensor device using triboelectric effect, the device comprising: a substrate; a first electrode layer disposed on the substrate; a graphene channel layer disposed on the substrate, wherein the graphene channel layer is flush with the first electrode layer, and is spaced from the first electrode layer; a gate dielectric layer in partial contact with the electrode layer and the graphene channel layer respectively; source and drain electrodes formed on both opposing ends of the graphene channel layer respectively; and a triboelectric layer formed on the first electrode layer, wherein the triboelectric layer generates a triboelectric potential via contact of an external friction material therewith, wherein the contact of the external friction material is detected based on a current change in the graphene channel layer due to the triboelectric potential applied thereto.

In one implementation of the first aspect, the substrate is a flexible substrate.

In one implementation of the first aspect, the gate dielectric layer induces a gate characteristic for the graphene channel layer.

In one implementation of the first aspect, the gate dielectric layer includes a two-dimensional insulating material or an ion-gel.

In one implementation of the first aspect, the triboelectric layer is made of a material located in a center region of a triboelectric series.

In a second aspect of the present disclosure, there is provided a method for manufacturing a graphene-based touch sensor device using triboelectric effect, the method comprising: providing a substrate; depositing a first electrode layer on the substrate; patterning the first electrode layer using a first photolithography process; transferring graphene onto the substrate to form a graphene layer such that the graphene layer is separated from the first electrode layer; forming source and drain electrodes partially on the graphene layer using a second photolithography process; etching the graphene layer using a third photolithography process to form a graphene channel layer; forming a gate dielectric layer so as to be partially in contact with the first electrode layer and the graphene channel layer respectively; and attaching a triboelectric layer on the first electrode layer.

In one implementation of the second aspect, the first photolithography process is a positive photolithography process.

In one implementation of the second aspect, the second photolithography process is a negative photolithography process.

In one implementation of the second aspect, the third photolithography process is a positive photolithography process.

In a third aspect of the present disclosure, there is provided a graphene-based touch sensor device using triboelectric effect, the device comprising: a substrate; a graphene channel layer disposed on the substrate; a gate dielectric layer disposed on the graphene channel layer; source and drain electrodes disposed on the graphene channel layer on both opposing ends of the graphene channel layer respectively, wherein the source and drain electrodes are separated from the gate dielectric layer; a further electrode layer disposed on the gate dielectric layer; and a triboelectric layer disposed on the further electrode layer, wherein the triboelectric layer generates a triboelectric potential via contact of an external friction material therewith, wherein the contact of the external friction material is detected based on a current change in the graphene channel layer due to the triboelectric potential applied thereto.

In one implementation of the third aspect, the substrate is a flexible substrate.

In one implementation of the third aspect, the gate dielectric layer induces a gate characteristic for the graphene channel layer.

In one implementation of the third aspect, the gate dielectric layer includes a two-dimensional insulating material or an ion-gel.

In one implementation of the third aspect, the triboelectric layer is made of a material located in a center region of a triboelectric series.

In a fourth aspect of the present disclosure, there is provided a method for manufacturing a graphene-based touch sensor device using triboelectric effect, the method comprising: providing a substrate; transferring graphene onto the substrate to form a graphene layer; forming source and drain electrodes partially on the graphene layer using a first photolithography process; etching the graphene layer using a second photolithography process to form a graphene channel layer; forming a gate dielectric layer on the graphene channel layer; depositing a further electrode layer on the gate dielectric layer; patterning the further electrode layer using a third photolithography process; and attaching a triboelectric layer on the patterned further electrode layer.

In one implementation of the fourth aspect, the third photolithography process is a positive photolithography process.

In one implementation of the fourth aspect, the first photolithography process is a negative photolithography process.

In one implementation of the fourth aspect, the second photolithography process is a positive photolithography process.

In accordance with the present disclosure, due to the bipolar nature of the graphene, charge transport control in the graphene channel is achieved by a gate bias thereto. Thus, whatever material comes in contact with the triboelectric layer, one of contacting and contacted materials is charged with a positive potential and the other thereof is charged with a negative potential. In this way, the triboelectric potential is generated. This triboelectric potential is then applied to the graphene layer as a gate bias. Thus, a current characteristic of the graphene layer changes instantaneously irrespective of the type of the material (metal or polymer) charged in contact with the present touch sensor, and/or the polarity of the electrostatic voltage thereof charged in the wet or dry surrounding environment. In this way, the present touch sensor reliably senses the touch applied thereto.

Further, in accordance with the present disclosure, the transparent and flexible touch sensor may be fabricated by using a transparent conductive electrode for the triboelectric generator on a flexible substrate.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 3A to FIG. 3C illustrate a driving mechanism of a graphene-based touch sensor using a triboelectric effect according to an embodiment of the present disclosure.

Figure 1:
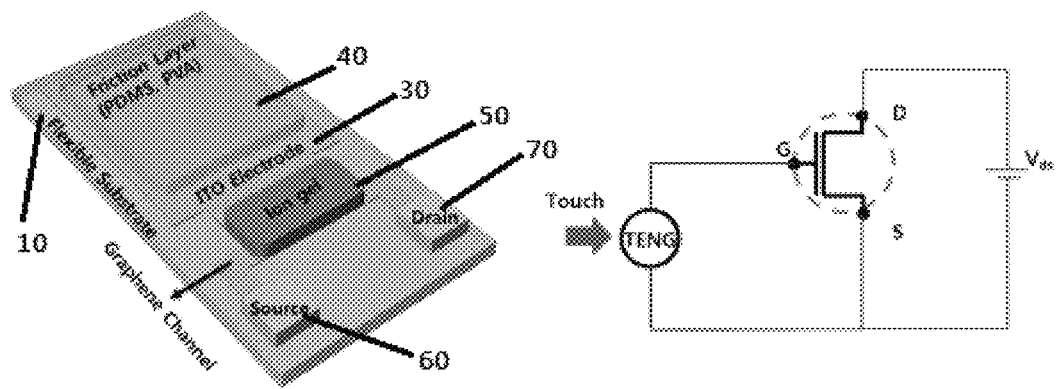
FIG. 1 illustrates a schematic perspective view of a graphene-based touch sensor using a triboelectric effect according to an embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

DETAILED DESCRIPTION OF THE INVENTION

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

The present disclosure relates to a touch sensor wherein triboelectric charging is applied to a graphene transistor wherein the triboelectric charging is a type of contact electrification in which certain materials become electrically charged after they come into frictional contact with a different material. More specifically, triboelectric charging may act as a gate bias source for the graphene transistor to control carrier transport in the graphene. In this connection, the touch sensor may be driven irrespective of types of materials generating the triboelectric effect. A transparent and flexible touch sensor may be fabricated by using a transparent electrode as a component of a triboelectric generator and using a graphene layer as a component of a graphene transistor.

In accordance with the present disclosure, a triboelectric generator and a graphene transistor is combined into by a single touch sensor. The triboelectric generator material contacts a certain material such that the certain material and the triboelectric generator material are charged to have opposite polarities due to a difference in work functions of the certain material and the triboelectric generator material, thereby to generate the triboelectric potential. Then, the triboelectric potential may be used as a gate bias source for controlling the carrier transport of the graphene transistor.

Graphene which has a hexagonal structure of a carbon mono-atomic layer in a two-dimensional plane behaves as a semi-metal and thus has very high carrier mobility, thermal conductivity, Young's modulus and high mechanical stability.

Particularly noteworthy is the bipolar nature of the graphene. Bipolarity means that charge transport control is achieved by a gate bias resulting from positive and negative potentials. Thus, whatever material comes in contact with the present touch sensor, one of contacting and contacted materials is charged with a positive potential and the other thereof is charged with a negative potential. In this way, an electrostatic or triboelectric potential is generated. This electrostatic or triboelectric potential is then applied to the graphene layer as a gate bias. Thus, a current characteristic of the graphene layer changes instantaneously irrespective of the type of the material (metal or polymer) charged in contact with the present touch sensor, and/or the polarity of the electrostatic voltage thereof charged in the wet or dry surrounding environment. In this way, the present touch sensor reliably senses the touch applied thereto.

Figure 2:
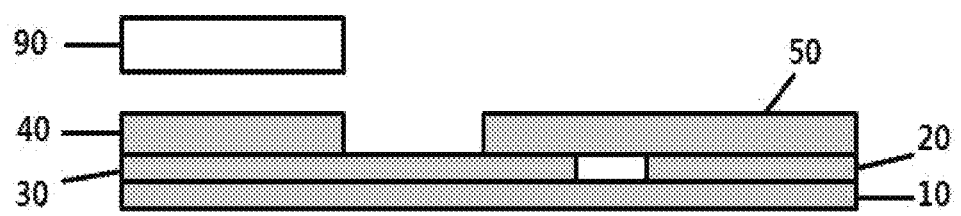
FIG. 2 illustrates a schematic side elevation view of a graphene-based touch sensor using a triboelectric effect according to an embodiment of the present disclosure.

FIG. 1 illustrates a schematic perspective view of a graphene-based touch sensor using a triboelectric effect according to an embodiment of the present disclosure. FIG. 2 illustrates a schematic side elevation view of a graphene-based touch sensor using a triboelectric effect according to an embodiment of the present disclosure.

The graphene-based touch sensor using a triboelectric effect according to an embodiment of the present disclosure includes a substrate 10; a graphene channel layer 20; an electrode layer 30; a source electrode 60; a drain electrode 70; a gate dielectric layer 50; and a triboelectric layer 40.

It is preferable that the substrate 10 is a flexible substrate, so that a flexible touch sensor may be finally manufactured. There are no particular restrictions on the substrate in terms of a material thereof. Examples thereof include cellulose-based resin, polyethylene terephthalate (PET), polyethylene naphthalate (PEN), polyethylene resin, polyvinyl chloride resin, polycarbonate (PC), polyethersulfone (PES), polyetherether ketone (PEEK), polyphenylene sulfide (PPS), and polyimide (PI).

The graphene channel layer 20 is disposed on the substrate and is flush with the electrode layer 30 disposed on the substrate. The graphene channel layer 20 is spaced apart from the electrode layer 30. The graphene channel layer 20 may be fabricated by transferring graphene and then patterning the graphene in a channel shape via etching. The graphene to be transferred is preferably a graphene manufactured by a CVD method capable of large-area synthesis.

The electrode layer 30 is spaced apart from the graphene channel layer 20 on the same plane. ITO is preferably used for the electrode material for the production of a transparent and flexible device. Such an electrode layer may be deposited on the substrate via thermal evaporation, e-beam evaporation, and sputtering processes, and then may be patterned using photolithography.

The gate dielectric layer 50 is formed so as to be partially in contact with the electrode layer 30 and the graphene channel layer 20, respectively. As shown in FIG. 2, the gate dielectric layer 50 is partially disposed on the graphene channel layer 20 and the electrode layer 30, and is partially in contact with the graphene channel layer 20 and the electrode layer 30. This gate dielectric layer induces the gate characteristics of the graphene-based transistor.

In order to achieve a general gate characteristic, the gate dielectric layer 50 may be formed by depositing a high-K material such as $SiO_2$, $Al_2O_3$, or $HfO_2$ by electron beam deposition, thermal deposition, or ALD atomic layer deposition process. However, it is preferable to use hexagonal boron nitride or ion gel as a two-dimensional insulating material in order to achieve a transparent and flexible gate characteristic. Particularly, a transparent and flexible two-dimensional material and ion gel are preferred.

The source electrode 60 and the drain electrode 70 are deposited on both ends of the graphene channel layer 20 respectively. As a result, the graphene-based transistor is formed. The triboelectric potential generated from the triboelectric generator may act as a gate bias source for controlling the charge transport of the graphene-based transistor. The source electrode 60 and the drain electrode 70 may be connected to an external circuit so that a signal corresponding to the touch applied to the triboelectric generator may be transmitted to the external circuit.

The triboelectric layer 40 may be formed on the electrode layer 30. The triboelectric layer 40 may contact an external rubbing material to generate the triboelectric potential. It is preferable to use a transparent and flexible polymer thin film as the triboelectric layer 40.

It is also preferable to use a material located in the center of the triboelectric series as the triboelectric layer 40. For example, it is preferable to use a PVA polymer thin film as the triboelectric layer 40. When PVA is used as the triboelectric layer 40, it is easy to cause positive or negative charging easily. This means that a positive or negative biased gate may be applied.

It may also be desirable to use a thin film of PDMS located on a negative side of the triboelectric series as the triboelectric layer 40. When PDMS is used as the triboelectric layer 40, it is possible to sense contact with various metals and polymers located on more positive sides relative to the PDMS on the triboelectric series.

The triboelectric layer 40 generates a triboelectric potential with the contact of the external friction material 90, whereby the touch thereto is detected according to the change of the current characteristic of the graphene channel layer. This will be described in more detail with reference to FIG. 3A to FIG. 3C.

In this way, the triboelectric layer is formed on the electrode layer, and the triboelectric potential may be generated by contacting the triboelectric layer with the external object. Accordingly, the combination of the triboelectric layer and the electrode layer corresponds to a triboelectric generator. In the present disclosure, the triboelectric generator and the graphene-based transistor are combined to implement a single touch sensor.

Figure 3A:
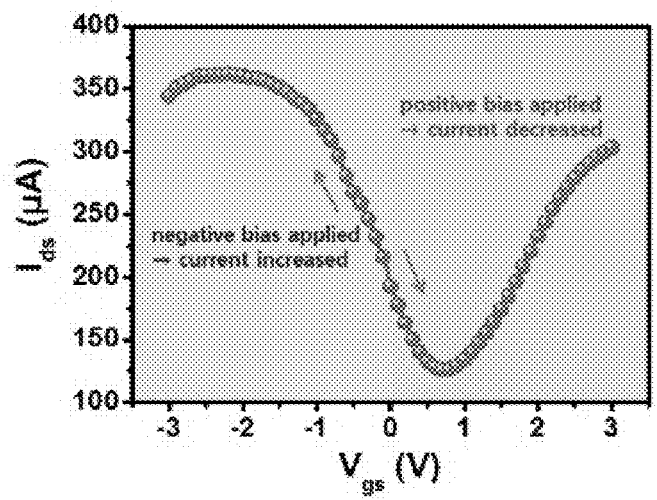
Figure 3A:
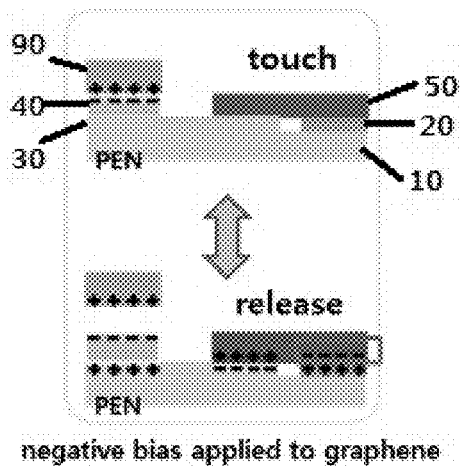
Figure 3A:
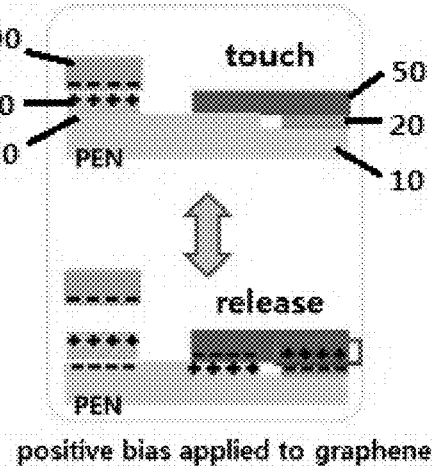

FIG. 3A to FIG. 3C illustrate a driving mechanism of a graphene-based touch sensor using a triboelectric effect according to an embodiment of the present disclosure.

Since, in general, graphene is doped with p-type properties by $O_2$ or $H_2O$ molecules in the atmosphere, a dirac point in the Ids-Vgs graph is shifted to the right. At this state, when a positive gate voltage is applied to the graphene by the triboelectric effect, the current Ids is reduced before the gate voltage is applied. To the contrary, when the negative gate voltage is applied to the graphene by the triboelectric effect, the current Ids is increased before the gate voltage is applied. This may be confirmed from FIG. 3A. As shown in FIG. 3A, the current Ids decreases when the gate voltage applied to the graphene-based transistor is a positive gate voltage due to the triboelectric effect. On the contrary, the current Ids increases when the gate voltage applied to the graphene-based transistor is a negative gate voltage due to the triboelectric effect. That is, depending on the polarity of the gate voltage applied, the current characteristics may vary.

Referring to FIG. 3B and FIG. 3C, the charged polarity differs depending on whether the material touching the triboelectric layer is located at a relatively positive or negative position on the triboelectric layer 30 relative to the triboelectric layer 30. The triboelectric potential generated due to the touching is applied as a gate bias to the graphene layer. Since the graphene has a bipolar characteristic, the current characteristic of the graphene is changed by the gate bias applied thereto, thereby enabling the sensing of the touch.

FIG. 3B illustrates an operation in which the external material 90 touching the triboelectric layer 30 is located at a relatively positive position on the triboelectric layer 30 relative to the triboelectric layer 30. FIG. 3C illustrates an operation in which the external material 90 touching the triboelectric layer 30 is located at a relatively negative position on the triboelectric layer 30 relative to the triboelectric layer 30. In the form case, a negative bias is applied to the graphene. In the latter case, a positive bias is applied to the graphene. Since the bipolar nature of graphene is used, whatever material 90 comes in contact with the present sensor, one of the external material and the triboelectric layer is charged with a positive polarity while the other of the external material and the triboelectric layer is charged with a negative polarity. As a result, the triboelectric potential is generated and, thus, the touch may be detected based on the potential. Regardless of the type of material (metal or polymer) charged in contact with the sensor, and the polarity of the triboelectric voltage charged in the wet or dry surrounding environment, the current characteristics of the graphene instantaneously change. Thus, the touch may be reliably detected.

Figure 4:
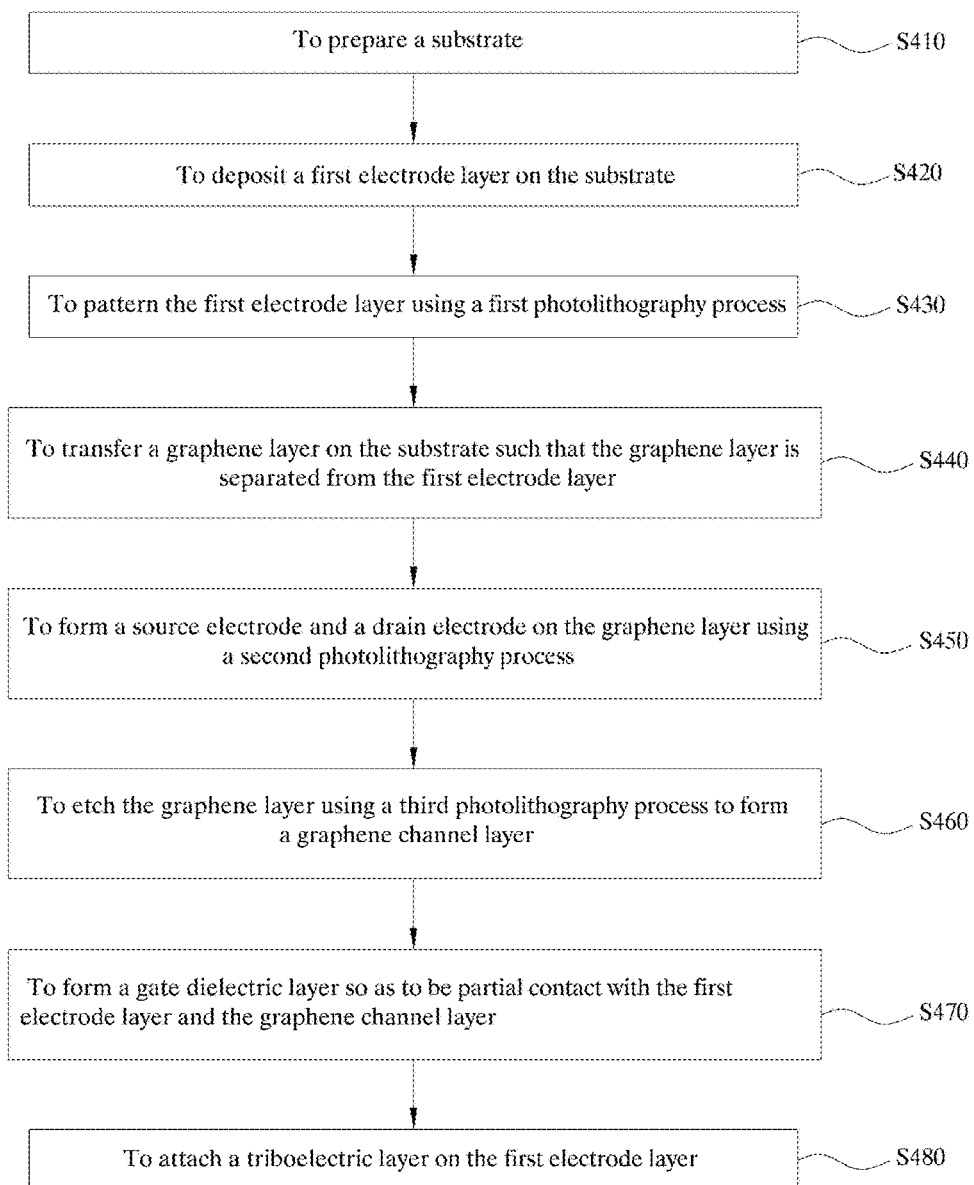
FIG. 4 illustrates a flowchart illustrating a method for manufacturing a graphene-based touch sensor using a triboelectric effect according to an embodiment of the present disclosure.

FIG. 4 illustrates a flowchart illustrating a method for manufacturing a graphene-based touch sensor using a triboelectric effect according to an embodiment of the present disclosure.

As shown in FIG. 4, a method for manufacturing a graphene-based touch sensor using a triboelectric effect according to an embodiment of the present disclosure includes preparing a substrate S 410; depositing a first electrode layer on the substrate S 420; patterning the first electrode layer using a first photolithography process S 430; transferring a graphene layer on the substrate such that the graphene layer is separated from the first electrode layer S 440; forming a source electrode and a drain electrode on the graphene layer using a second photolithography process S 450; etching the graphene layer using a third photolithography process to form a graphene channel layer S 460; forming a gate dielectric layer so as to be partial contact with the first electrode layer and the graphene channel layer S 470; and attaching a triboelectric layer on the first electrode layer S 480.

At the S 410 operation, it is preferable that a flexible substrate is used in preparing the substrate. Thus, finally, a flexible touch sensor may be manufactured.

In the S 420 operation, the first electrode layer is deposited on the substrate. As the electrode material, transparent ITO may be preferably used. ITO may be deposited on the substrate via thermal evaporation, e-beam evaporation, and sputtering process. When ITO is deposited, it may be deposited on the entire substrate. When a desired shape of a shadow mask is prepared, only a specific portion may be deposited.

In the S 430 operation, the first electrode layer is patterned using a first photolithography process. The deposited electrode may be patterned using a positive photolithography process and, then, the remaining portion may etched with an etching solution. The etching solution may be HCl, aqua regia ($NH_3+3HCl$) or a commercially available ITO etching solution.

In the S 440 operation, graphene is transferred to form a graphene layer. Optionally, Cu/Ni may be formed and etched with a $FeCl_3$ solution to be used as a catalyst to transfer CVD-grown graphene to the substrate. It takes at least 10 minutes or more to completely remove the Cu/Ni using the solution. If the etching is not sufficient, the characteristics of the graphene layer may be deteriorated due to fine metal grains which are not removed on the graphene surface.

In the S 450 operation, a source electrode and a drain electrode are formed on the graphene layer using a second photolithography process. In this connection, since patterning is associated with electrode deposition, only portions on which the source and drain electrodes are to be disposed may be developed with a developer using by a second photolithography process, in particularly, in a negative manner. When the photolithography process has been completed, metal is deposited via a deposition apparatus such as an electron beam evaporator, a thermal evaporator, and a sputter sputtering apparatus. In this connection, any conductive metal may be used. However, considering the contact resistance between the graphene and the metal, gold (Au) with relatively low resistance may be deposited. Since the adhesion of gold to the graphene is not good, a metal layer such as titanium (Ti) or chromium (Cr) may be first deposited about 2 to 5 nm thick and then gold may be deposited thereon. In this connection, the thickness of gold may be required to be at least 30 nm.

The S 460 operation is to form a graphene channel layer by etching the graphene layer using a third photolithography process. In the S 450 operation, the source and drain electrode have been deposited. A positive photolithography method may be used to form a graphene channel pattern between the source and drain electrodes to form a graphene channel between the deposited electrodes. At this time, the size of graphene channel is not limited. To etch the graphene layer into a desired shape, the etching process may employ oxygen plasma.

In the S 470 operation, a gate dielectric layer is formed so that the first electrode layer and the graphene channel layer are partially in contact with the gate dielectric layer. To derive the gate characteristics of graphene, a dielectric layer must be formed. In this connection, the dielectric layer should be in contact with both the ITO electrode and the graphene channel layer. In order to achieve general gate characteristics, general high-K materials such as $SiO_2$, $Al_2O_3$ and $HfO_2$ may be deposited by electron beam deposition, thermal deposition, or ALD atomic layer deposition. However, in order to achieve a transparent and flexible gate layer, hexagonal boron nitride or ion gel as a two-dimensional insulating material such as graphene, may be preferably used. In one embodiment, bis(tri-uoromethyl sulfonyl) imide ([EMIM] [TFSI]) ion liquid, poly(ethylene glycol) diacrylate (PEGDA) monomer, and 2-hydroxy-2-methylpropiophenone (HOMPP) photo-initiator are mixed at an appropriate ratio and are exposed to the UV ray. In this way, an example gate layer may be formed.

In the S 480 operation, a triboelectric layer is deposited on the first electrode layer. In this connection, the triboelectric layer may contact an external rubbing material to generate the triboelectric potential. It is preferable to use a transparent and flexible polymer thin film as the triboelectric layer. It is also preferable to use a material located in the center of the triboelectric series as the triboelectric layer. For example, it is preferable to use a PVA polymer thin film as the triboelectric layer. When PVA is used as the triboelectric layer, it is easy to cause positive or negative charging easily. This means that a positive or negative biased gate may be applied. It may also be desirable to use a thin film of PDMS located on a negative side of the triboelectric series as the triboelectric layer. When PDMS is used as the triboelectric layer, it is possible to sense contact with various metals and polymers located on more positive sides relative to the PDMS on the triboelectric series.

The performance of the graphene-based touch sensor using the triboelectric effect according to one embodiment of the present disclosure described above may be seen from FIG. 5 to FIG. 8.

The graphene-based touch sensor using the triboelectric effect according to an embodiment of the present disclosure used in the test in FIG. 5 to FIG. 8 includes a PEN substrate, an ITO electrode, a CVD-grown graphene channel layer, an ion-gel based gate dielectric layer, and a PVA polymer based thin film triboelectric layer.

Figure 5:
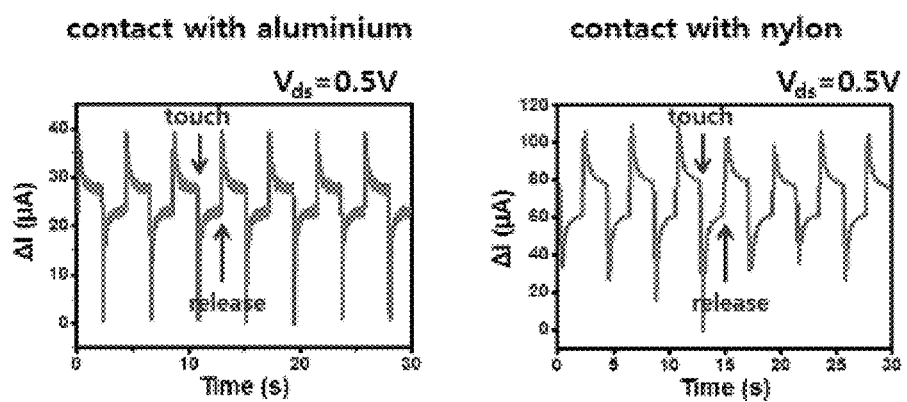
FIG. 5 shows graphs illustrating a current change of a graphene-based touch sensor using a triboelectric effect according to an embodiment of the present disclosure when a triboelectric layer of the sensor is charged via contact with external aluminum or nylon.

FIG. 5 shows graphs illustrating a current change of a graphene-based touch sensor using a triboelectric effect according to an embodiment of the present disclosure when a triboelectric layer of the sensor is charged via contact with external aluminum or nylon. It is confirmed that the triboelectric effect always occurs and thus touch is reliably sensed, regardless of whether the external contact material is metallic (aluminum) or polymeric (nylon).

Figure 6:
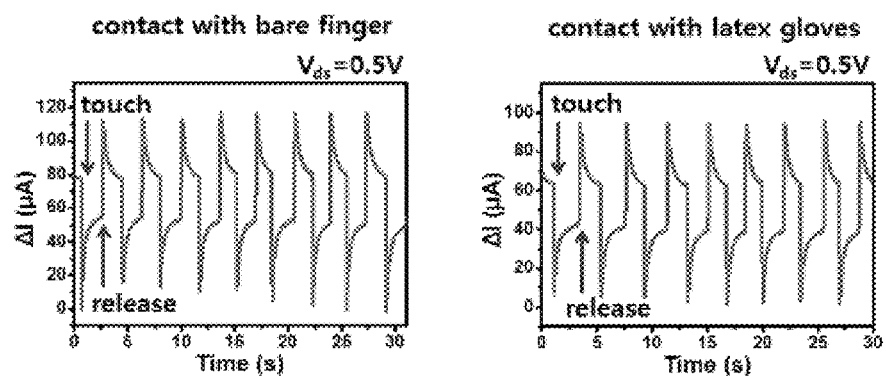
FIG. 6 shows graphs illustrating a current change of a graphene-based touch sensor using a triboelectric effect according to an embodiment of the present disclosure when a triboelectric layer of the sensor is charged via contact with an external human bare finger or a latex glove-wearing hand.

FIG. 6 shows graphs illustrating a current change of a graphene-based touch sensor using a triboelectric effect according to an embodiment of the present disclosure when a triboelectric layer of the sensor is charged via contact with an external human bare finger or a latex glove-wearing hand. It is confirmed that that the triboelectric effect always occurs and thus touch is reliably sensed, regardless of whether the external contact material is conductive such as the human bare finger or non-conductive such as the latex glove.

Figure 7:
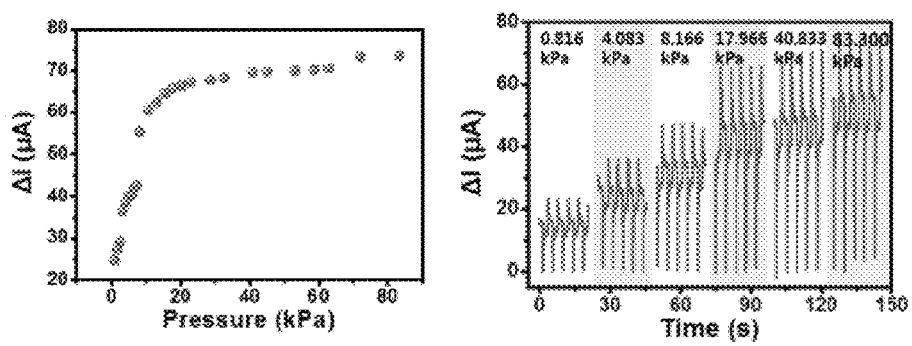
FIG. 7 shows graphs illustrating a change in current based on a pressure applied to a graphene-based touch sensor using a triboelectric effect according to an embodiment of the present disclosure.

FIG. 7 shows graphs illustrating a change in current based on a pressure applied to a graphene-based touch sensor using a triboelectric effect according to an embodiment of the present disclosure. It may be seen that a very wide range of pressure of 0.8 to 80 kPa may be detected using the present sensor device. In this connection, it may be seen that a larger current change occurs at a larger pressure touch.

Up to now, the graphene-based touch sensor using the triboelectric effect according to one embodiment of the present disclosure, and the manufacturing method thereof have been described. Hereinafter, a graphene-based touch sensor using a triboelectric effect according to a further embodiment of the present disclosure and a manufacturing method thereof will be described. Between both embodiments, the driving mechanism is the same, but there is a slight difference in the structure and the manufacturing method. Therefore, the difference will be mainly described below, and descriptions of overlapping portions therebetween will be omitted.

Figure 8:
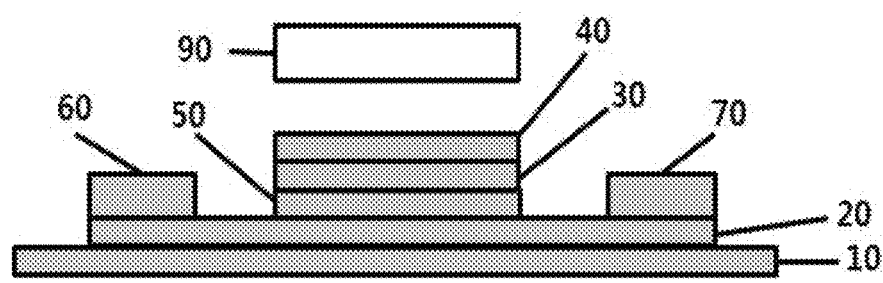
FIG. 8 illustrates a graphene-based touch sensor using a triboelectric effect according to a further embodiment of the present disclosure.

FIG. 8 illustrates a graphene-based touch sensor using a triboelectric effect according to a further embodiment of the present disclosure.

A graphene-based touch sensor using a triboelectric effect according to a further embodiment of the present disclosure comprises a substrate 10; a graphene channel layer 20; a gate dielectric layer 50; a source electrode 60; a drain electrode 70; an electrode layer 30; and a triboelectric layer 40.

In the graphene-based touch sensor using the triboelectric effect according to the further embodiment of the present disclosure, the graphene channel layer 20 and the electrode layer 30 are not horizontally arranged on the same plane but are stacked vertically.

The graphene channel layer 20 is disposed on the substrate 10. The gate dielectric layer 50 is disposed on the graphene channel layer 20. In addition, the electrode layer 30 and the triboelectric layer 40 are sequentially stacked on the gate dielectric layer 50 to form a triboelectric generator. In addition, the source electrode 60 and drain electrode 70 are formed on both ends of the graphene channel layer 20 respectively to form a graphene-based transistor. Thus, the triboelectric generator and the graphene-based transistor are combined with each other to complete a single touch sensor.

Regarding the driving mechanism, as in the embodiment described above, the triboelectric layer generates the triboelectric potential with the contact of the external friction member therewith, and thus the charge is moved due to the potential. In this way, the touch is detected based on the change of the current characteristic in the graphene channel layer.

Figure 9:
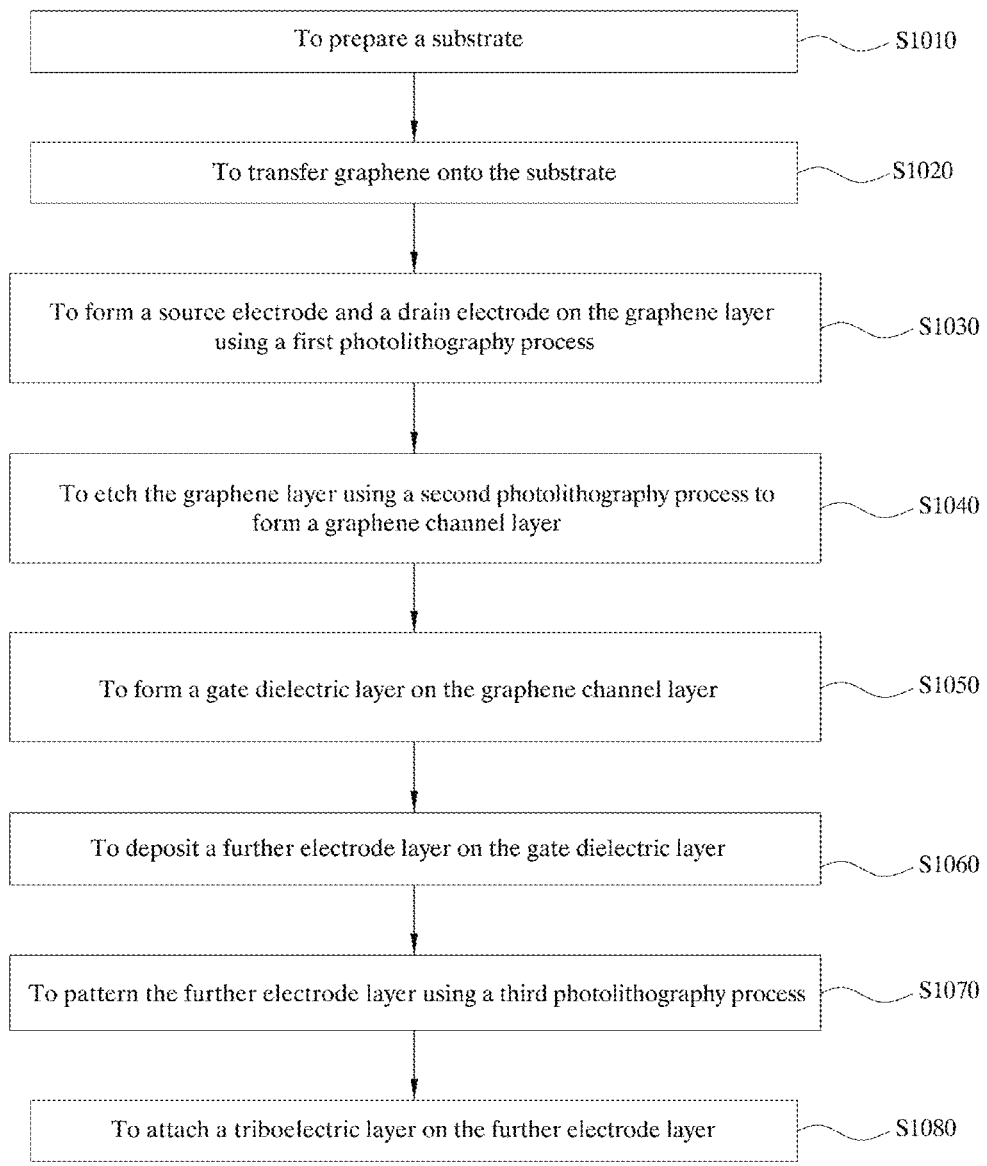
FIG. 9 shows a flowchart illustrating a method for manufacturing a graphene-based touch sensor using a triboelectric effect according to a further embodiment of the present disclosure.

FIG. 9 shows a flowchart illustrating a method for manufacturing a graphene-based touch sensor using a triboelectric effect according to a further embodiment of the present disclosure.

A method of fabricating a graphene-based touch sensor using a triboelectric effect according to a further embodiment of the present disclosure includes preparing a substrate S 1010; transferring graphene onto the substrate S 1020 to form a graphene layer; forming a source electrode and a drain electrode on the graphene layer using a first photolithography process S 1030; etching the graphene layer using a second photolithography process to form a graphene channel layer S 1040; forming a gate dielectric layer on the graphene channel layer S 1050; depositing a further electrode layer on the gate dielectric layer S 1060; patterning the further electrode layer using a third photolithography process S 1070; and attaching a triboelectric layer on the further electrode layer S 1080.

The operation of patterning the further electrode layer may be performed using a positive photolithography process. The operation of forming the source electrode and drain electrode on the graphene channel layer may be performed using a negative photolithography process. The etching operation of the graphene layer to form the graphene channel layer may be performed using a positive photolithography process.

The remaining operations are the same as those of the embodiment already described above. Thus, a detailed description thereof will be omitted.

It is to be understood that while the present disclosure has been particularly shown and described with reference to the exemplary embodiments thereof, the disclosure is not limited to the disclosed exemplary embodiments. On the contrary, it will be understood by those skilled in the art that various modifications may be made without departing from the spirit and scope of the present disclosure.

It is understood by those skilled in the art that various variants and alternatives may be selected in the present disclosure without departing from the spirit or scope of the present disclosure. Accordingly, it is intended that the present disclosure covers the modifications and variations when they come within the scope of the appended claims and their equivalents.

In the present specification, a reference has been made to all the device and method disclosures. In this connection, the descriptions of the device and method disclosures may be applied to each other in a supplementing manner.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

The invention claimed is:

1. A graphene-based touch sensor device using triboelectric effect comprising:
   a substrate;
   a graphene channel layer disposed on the substrate;
   a gate dielectric layer;
   a source and drain electrodes; and
   a triboelectric layer,
      wherein the triboelectric layer generates a triboelectric potential via contact of an external friction material therewith,
      wherein the contact of the external friction material is detected based on a current change in the graphene channel layer due to the triboelectric potential applied thereto.

2. The device of claim 1 comprising:
   a substrate;
   a first electrode layer disposed on the substrate;
   a graphene channel layer disposed on the substrate, wherein the graphene channel layer is
   flush with the first electrode layer, and is spaced from the first electrode layer;
   a gate dielectric layer in partial contact with the electrode layer and the graphene channel layer respectively;
   source and drain electrodes formed on both opposing ends of the graphene channel layer respectively; and
   a triboelectric layer formed on the first electrode layer,
      wherein the triboelectric layer generates a triboelectric potential via contact of an external friction material therewith, wherein the contact of the external friction material is detected based on a current change in the graphene channel layer due to the triboelectric potential applied thereto.

3. The device of claim 2, wherein the substrate is a flexible substrate.

4. The device of claim 2, wherein the gate dielectric layer induces a gate characteristic for the graphene channel layer.

5. The device of claim 2, wherein the gate dielectric layer includes a two-dimensional insulating material or an ion-gel.

6. The device of claim 2, wherein the triboelectric layer is made of a material located in a center region of a triboelectric series.

7. The device of claim 1 comprising:
a substrate;
a graphene channel layer disposed on the substrate;
a gate dielectric layer disposed on the graphene channel layer;
source and drain electrodes disposed on the graphene channel layer on both opposing ends of the graphene channel layer respectively, wherein the source and drain electrodes are separated from the gate dielectric layer;
a further electrode layer disposed on the gate dielectric layer; and
a triboelectric layer disposed on the further electrode layer,
wherein the triboelectric layer generates a triboelectric potential via contact of an external friction material therewith,
wherein the contact of the external friction material is detected based on a current change in the graphene channel layer due to the triboelectric potential applied thereto.

8. The device of claim 7, wherein the substrate is a flexible substrate.

9. The device of claim 7, wherein the gate dielectric layer induces a gate characteristic for the graphene channel layer.

10. The device of claim 7, wherein the gate dielectric layer includes a two-dimensional insulating material or an ion-gel.

11. The device of claim 7, wherein the triboelectric layer is made of a material located in a center region of a triboelectric series.

12. A method for manufacturing a graphene-based touch sensor device using triboelectric effect comprising:
providing a substrate;
transferring graphene onto the substrate to form a graphene layer;
forming source and drain electrodes partially on the graphene layer;

etching the graphene layer;
forming a gate dielectric layer on an electrode layer; and
attaching a triboelectric layer on the electrode layer.

13. The method of claim 12 comprising:
providing a substrate;
depositing a first electrode layer on the substrate;
patterning the first electrode layer using a first photolithography process;
transferring graphene onto the substrate to form a graphene layer such that the graphene layer is separated from the first electrode layer;
forming source and drain electrodes partially on the graphene layer using a second photolithography process;
etching the graphene layer using a third photolithography process to form a graphene channel layer;
forming a gate dielectric layer so as to be partially in contact with the first electrode layer and the graphene channel layer respectively; and
attaching a triboelectric layer on the first electrode layer.

14. The method of claim 13, wherein the first photolithography process is a positive photolithography process.

15. The method of claim 13, wherein the second photolithography process is a negative photolithography process.

16. The method of claim 13, wherein the third photolithography process is a positive photolithography process.

17. The method of claim 12 comprising:
providing a substrate;
transferring graphene onto the substrate to form a graphene layer;
forming source and drain electrodes partially on the graphene layer using a first photolithography process;
etching the graphene layer using a second photolithography process to form a graphene channel layer;
forming a gate dielectric layer on the graphene channel layer;
depositing a further electrode layer on the gate dielectric layer;
patterning the further electrode layer using a third photolithography process; and
attaching a triboelectric layer on the patterned further electrode layer.

18. The method of claim 17, wherein the third photolithography process is a positive photolithography process.

19. The method of claim 17, wherein the first photolithography process is a negative photolithography process.

20. The method of claim 17, wherein the second photolithography process is a positive photolithography process.

* * * * *